United States Patent [19]
Bush et al.

[11] Patent Number: 5,132,642
[45] Date of Patent: Jul. 21, 1992

[54] PLL USING ASYNCHRONOUSLY RESETTABLE DIVIDER TO REDUCE LOCK TIME

[75] Inventors: Harry D. Bush, Palatine; Paul J. Weber, Elgin, both of Ill.

[73] Assignee: Motorola, Inc., Schaumburg, Ill.

[21] Appl. No.: 771,593

[22] Filed: Oct. 4, 1991

[51] Int. Cl.$^5$ .......................... H03L 7/085; H03L 7/18
[52] U.S. Cl. ....................... 331/1 A; 331/25; 331/27; 377/107; 377/119
[58] Field of Search .......................... 331/1 A, 25, 27; 377/107, 119

[56] References Cited

U.S. PATENT DOCUMENTS

4,931,748  6/1990  McDermott et al. .............. 331/1 A

Primary Examiner—Siegfried H. Grimm
Attorney, Agent, or Firm—Joseph P. Krause

[57] ABSTRACT

An asynchronously resettable counter/divider (25) in a phase-locked loop (PLL) for a frequency synthesizer (12) reduces the lock-up time for the PLL by resetting the resettable counter/divider when the phase difference between the output signal from a VCO (20, 21) and a low frequency reference signal (30) exceeds a predetermined value.

8 Claims, 8 Drawing Sheets

FIG.1

—PRIOR ART—

—PRIOR ART—

PLL USING ASYNCHRONOUSLY RESETTABLE DIVIDER TO REDUCE LOCK TIME

FIELD OF THE INVENTION

This invention relates to frequency synthesizers. In particular, this invention relates to methods and devices to reduce the lock time required for a frequency synthesizer to achieve a stable output signal.

BACKGROUND OF THE INVENTION

Frequency synthesizers are well known in the electronic art. A desirable characteristic of a frequency synthesizer is its ability to provide a stable output frequency across a range, or band, of frequencies. Stable frequency generation is typically accomplished by using a so called phase-locked loop (PLL).

Figure 1:
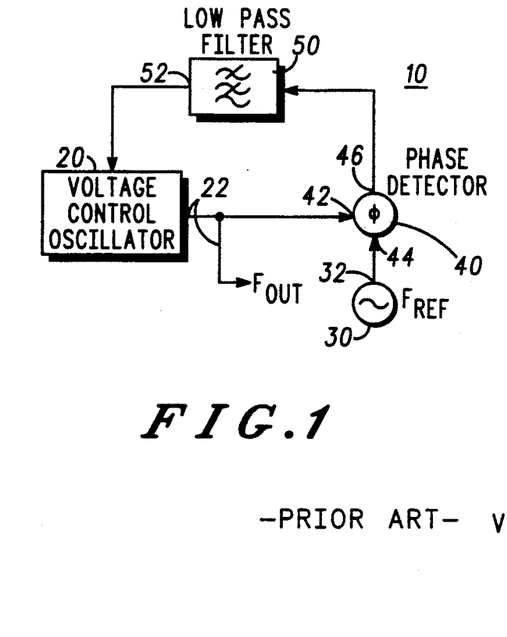
FIG. 1 shows a schematic diagram of a prior art frequency synthesizer using a phase locked loop.

FIG. 1 depicts a simplified schematic diagram of a prior art PLL frequency synthesizer (10). The PLL synthesizer (10) includes a voltage controlled oscillator (VCO) (20), the output frequency of which can be adjusted by an input control voltage. A phase detector (40) compares the output frequency of the signal from the VCO (20) against a reference signal (30) and produces, at an output port of the phase detector (46), a control signal that is related to or derived from the phase difference between the VCO (20) signal and the reference signal (30).

Figure 1A:
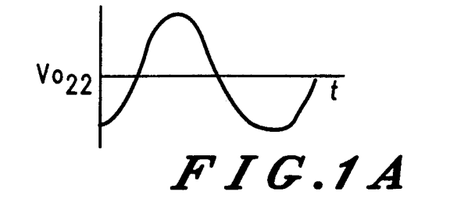
FIG. 1A shows a waveform output from the VCO shown in FIG. 1.
Figure 1B:
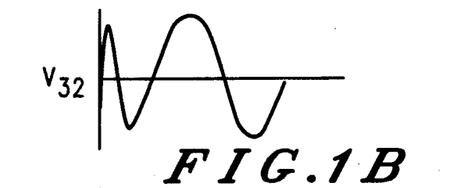
FIG. 1B shows the output voltage from the low frequency reference source, which source is comprised of the oscillator (30) and its output frequency divider (34)
Figure 1C:
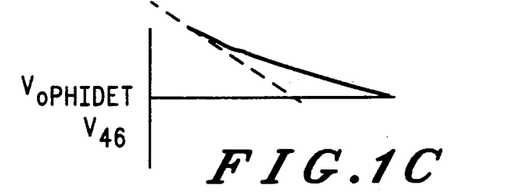
FIG. 1C shows the low-pass filtered output voltage from the phase detector of FIG. 1 over time.

A low-pass filter (50) coupled to the output of the phase detector (40) produces a relatively slowly changing (sometimes near D.C.) control signal, typically having a predetermined magnitude and polarity, that when input to the control input of the VCO (20), causes the VCO output signal to match the phase and therefore frequency of the reference signal (30). If for example, the output frequency of the VCO (20) is initially at some frequency $f_1$ (as it is depicted in FIG. 1A), and if at this same particular instant in time the output of the reference signal source (30) is at a slightly different frequency $f_2$ (as it is depicted in FIG. 1B, where $f_2 \approx f_1 + \Delta\phi$, and where $\Delta\phi$ might be positive or negative), these two signals, $f_1$ and $f_2$ at this particular time will differ by some phase angle amount, $x \approx \Delta\phi$, if $f_1 \approx f_2$. The phase angle difference between $f_1$ and $f_2$ will produce an output voltage signal from the phase detector (40) that is a voltage proportional to the magnitude of the phase (or frequency) difference between the two signals, which signal from the phase detector (40) when coupled to the control input of the VCO (20) will cause the frequency of the output signal of the VCO to change toward the frequency of the reference signal (30). As the output frequency of the VCO (20) changes in response to the control signal from the phase detector (40), the phase angle difference between the VCO output signal and the reference signal will decrease. Over time, the phase angle difference between the output of the VCO (20) and the reference signal (30) will tend to zero, producing a correspondingly decreasing output voltage from the phase detector (40), as indicated in FIG. 1C. In the phase locked loop shown in FIG. 1, the output voltage of the phase detector (40) eventually reaches zero, as shown in FIG. 1C, as the frequency of the VCO changes to identically match the output frequency of the reference signal (30).

In many communications applications, a frequency synthesizer must be very stable. In many of these applications, the output frequency for the synthesizer must be changeable in very small, incremental steps. The output frequency of the synthesizer shown in FIG. 1 can be made changeable by discrete, incremental steps by using a reference frequency source (30) having an output frequency equal to the desired step size and using a changeable frequency divider at the output of the VCO (20) to divide the output frequency of the VCO down to the frequency of the reference signal. In such a circuit, the output frequency of the VCO (20) will change by an amount required to lock its output frequency, divided by the division factor of the frequency divider, to the frequency of the reference signal (30).

Figure 2:
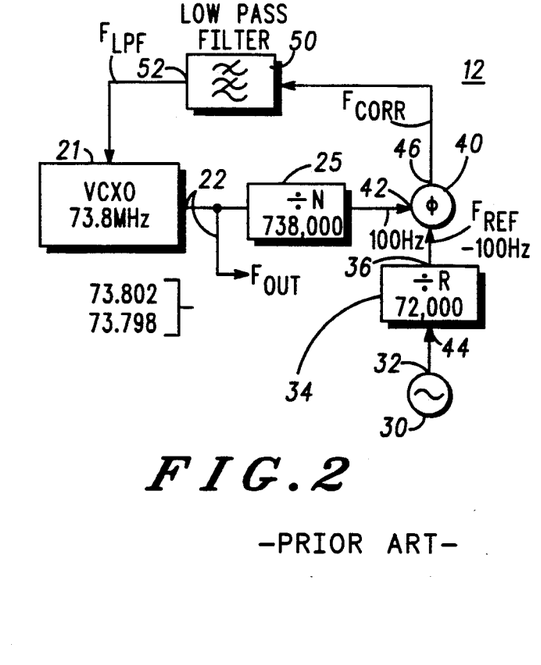
FIG. 2 shows an improved prior art frequency phase locked loop used in a frequency synthesizer.
Figure 2A:
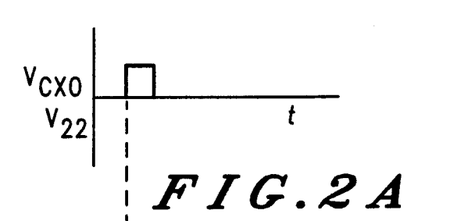
FIG. 2A shows a representative output pulse from the VCXO shown in FIG. 2.
Figure 2B:
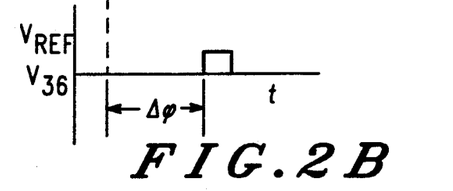
FIG. 2B shows an arbitrary pulse output from the reference signal source (34 and 30) shown in FIG. 2.
Figure 2C:
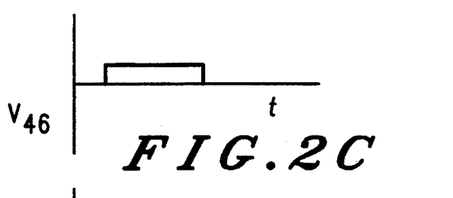
FIG. 2C shows a hypothetical output from the phase detector (40) shown in FIG. 2 produced by the phase differences between the signals shown in 2A and 2B.
Figure 2D:
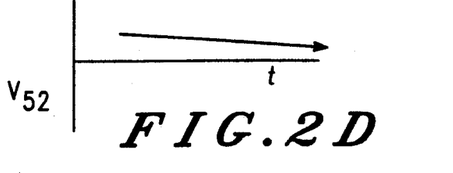
FIG. 2D shows the low-pass filtered output of the phase detector (40) of FIG. 2 over time.

In FIG. 2, there is shown a prior art frequency synthesizer (12) that uses a voltage controlled crystal oscillator (21) which has significantly greater frequency stability than other types of oscillator circuits. By means of the programmable divider (25) and a low frequency reference signal (provided by the reference oscillator (30) and a second frequency divider (34) that divides the output of the reference oscillator (30)), the synthesizer shown in FIG. 2 (12) provides an output signal frequency that is changeable in small incremental frequency steps across the frequency range of the VCXO.

In FIG. 2, the voltage controlled crystal oscillator (21) (hereinafter referred to as VCXO) has a nominal crystal resonant frequency of 73.8 MHz. It is well known in the art that this resonant frequency can be pulled slightly using a varactor tuning technique to provide a frequency adjustable between 73.798 and 73.802 MHz. The voltage swing between these two frequencies is accomplished by means of a control voltage derived from the phase difference between the signals input to the phase detector (40) i.e. the output of the first divider (25) compared to the output of the second divider (34). The phase detector (40) produces its output control voltage $F_{corr}$ by comparing the divided-down output frequency of the VCXO (divided by a number between 738,000 and 738,032 in FIG. 2 to yield a signal of approximately 100 Hz.) to the output frequency of the reference frequency signal (30) (also a signal near 100 Hz.).

If the divisors of these two divider circuits (25 and 34) are selected to both produce a resultant quotient that is approximately equal to the frequency step size desired from the synthesizer (a step size of 100 Hz. in FIG. 2), the control signal output from the phase detector (40) as it is filtered by the low-pass filter, will only change the output frequency of the VCO by an amount required to lock the VCO signal to a multiple of the reference signal.

For example, if the VCXO's nominal resonant frequency is 73.8 MHz. and the division factor and the first divider (25) is selected to be a division ratio of 738,000 the product of the division of the VCXO output signal $F_{out}$ by the divisor factor of the divider (25) will be approximately equal to 100 Hz. If for example the reference frequency (30) is selected to be a reference oscillator of a 7.200 MHz. frequency and if the divisor R in the second divider (34) is selected to be equal to 72,000, the resultant signal from the reference source (30) divided by the division factor in the second divider (34) will also be a signal of approximately 100 Hz.

In a frequency synthesizer such as the one shown in FIG. 2, using a VCXO, (a voltage controlled crystal oscillator) which has a relatively narrow tuning range, very large division factors in the divider (25), will cause the frequency synthesizer (12) to have extremely long lock up times because of the relatively small correction signal from the phase detector (40) and the very narrow tuning range of the VCXO. Long lock up times for a frequency synthesizer render it useless during the time that the VCO output frequency is changing. In a radio using such a synthesizer, the radio would be unusable during the time that the synthesizer is attempting to lock up to the reference signal.

For example, if the output from the first divider (25) is exactly 180 degrees out of phase with respect from the reference divider (34), (Such as when the synthesizer is powered up for example.), the phase detector (40) will output a signal to the VCXO (21) to go to its maximum (or minimum) output frequency needed to bring the output of the first divider (25) into phase synchronization with the reference signal from the second divider (30 and 34 together). In the circuit shown in FIG. 2, because of the limited VCXO tuning range, it will tune up (or down) by only about 5 KHz. This translates into a frequency change to the VCXO output frequency, divided by the divider (25), equal to 5 KHz ÷738,000, or about 0.00677 Hz. Since a frequency change of 1 Hz equals 360 degrees per second, the frequency range 0.00677 Hz. results in the dividers (25) output changing of 2.4 degrees per second. At this rate, assuming that the output from the first counter (25) is initially 180 degrees out of phase with respect to the output from the second counter (34), it will take 74 seconds to bring the two 100 Hz signals into phase lock.

A frequency synthesizer that is capable of providing small incremental steps in output frequency adjustment that uses a crystal controlled oscillator and a minimum number of division stages and that provides a reduced lock time would be an improvement over the prior art. In communications applications where such types of frequency synthesizers are used, many secondary benefits from reduced lock up time might be realized.

SUMMARY OF THE INVENTION

There is provided a frequency synthesizer that has a reduced lock up time that provides a very stable, high-frequency output signal across a relatively narrow output frequency range in small incremental steps. The preferred embodiment of the synthesizer is comprised of a VCXO, a voltage controlled oscillator having a relatively narrow output frequency range, an asynchronously resettable programmable frequency divider coupled to the output of the VCXO provides a low frequency comparison signal that is compared to a low frequency reference signal. Both the comparison and reference signals are input to a phase detector, the output of which is used to control the VCXO.

A frequency divider reset circuit, coupled to the resettable frequency divider, asynchronously resets the programmable frequency divider when the phase difference between the comparison signal and the reference signal exceeds a predetermined phase angle difference. Asynchronously resetting the programmable frequency divider permits the synthesizer the capability of locking itself to the low frequency reference source within a shorter time period, and in times as little as one time period of the low frequency reference signal.

DESCRIPTION OF A PREFERRED EMBODIMENT

Figure 3:
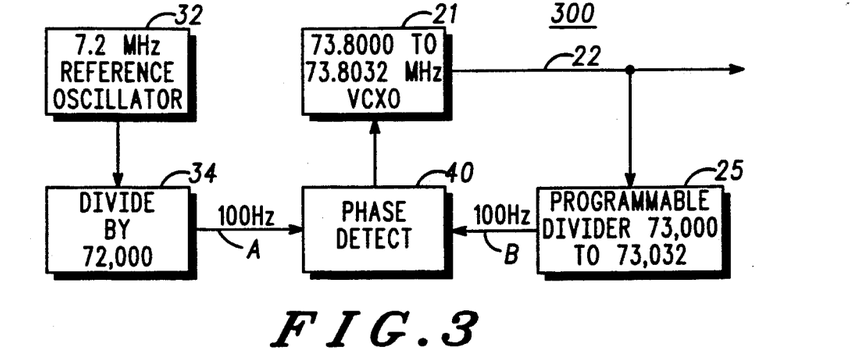
FIG. 3 shows a block diagram of a frequency synthesizer in which the invention is embodied.

FIG. 3 shows a block diagram of the functional elements used to implement a frequency synthesizer (300) that tunes from 73.8000 to 73.8032 MHz in 100 Hz steps and that provides frequency stability attainable with crystal oscillators. In the preferred embodiment the worst case lock time (the time required for the output signal (22) to be considered stable and phase locked to the reference oscillator (32)) was approximately 1.8 seconds, but this time could have been reduced using different topologies which will be explained below.

In the embodiment shown in FIG. 3, the voltage controlled oscillator is a voltage controlled crystal oscillator, or VCXO, (21) that is tunable from 73.8000 to 73.8032 MHz using a commonly known varactor tuning method. Such a tuning method is commonly used in temperature compensated crystal oscillators (TCXO's) to correct for frequency variations caused by temperature changes or for modulating such oscillators. The output of the VCXO (21) is coupled to a digital, asynchronously resettable programmable divider (25), the division factor of which ranges from 738,000 to 738,032. Dividing the VCXO output, (which ranges from 73.8 to 73.8032 MHz.) by a number ranging between 738,000 and 738,032 produces an output frequency at B that is equal to 100 Hz. (The implementation of the asynchronously resettable programmable divider (25) is detailed below and is a component, depicted in FIG. 3, in which at least part of the invention is embodied.)

A 7.2 MHz reference oscillator (32) has its output divided by a constant division factor, (although alternate embodiments of the invention would include dividing the signal from the reference oscillator (32) by variable factors) and in the embodiment shown in FIG. 3 was a division factor equal to 72,000. (Dividing 7.2 MHz. by 72,000 yields a quotient of 100 Hz.) This divider circuit (34) has its output coupled to the phase detector (40) that compares the output from the programmable divider (25) to produce a control signal for the VCXO (21). Achievement of the reduced lock up time is attained by an enhancement to the programmable divider (25) and an improved phase detector (40) the operation of which is explained below.

Figure 4:
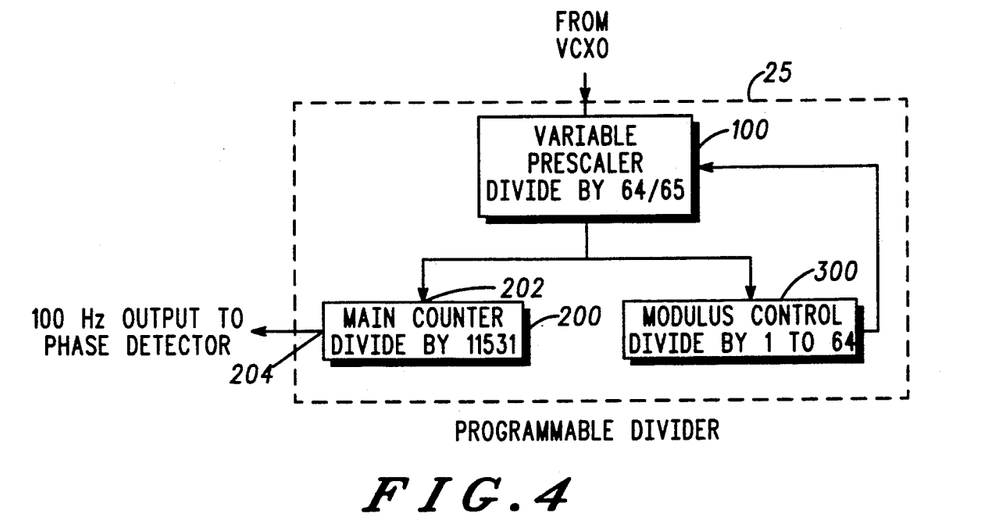
FIG. 4 shows elements within the programmable divider shown in FIG. 3 that are used in the preferred embodiment of the invention.

For various practical considerations in the implementation of the programmable divider (25), in FIG. 4, there is shown a variable prescaler (100) as well as a main divide counter (200) and a modulus control circuit (300) that are all part of the programmable divider (25). The variable prescaler divides the programmable divider's input signal from the VCXO by one of two factors, i.e., 64 or 65, depending upon the desired output frequency. A secondary divide circuit called a modulus control circuit (300) selects the variable prescaler divide ratio to be either 64 or 65. It is the main divide counter (200), which has a constant division factor equal to 11,531, which produces the resultant 100 Hz. output signal.

Figure 5:
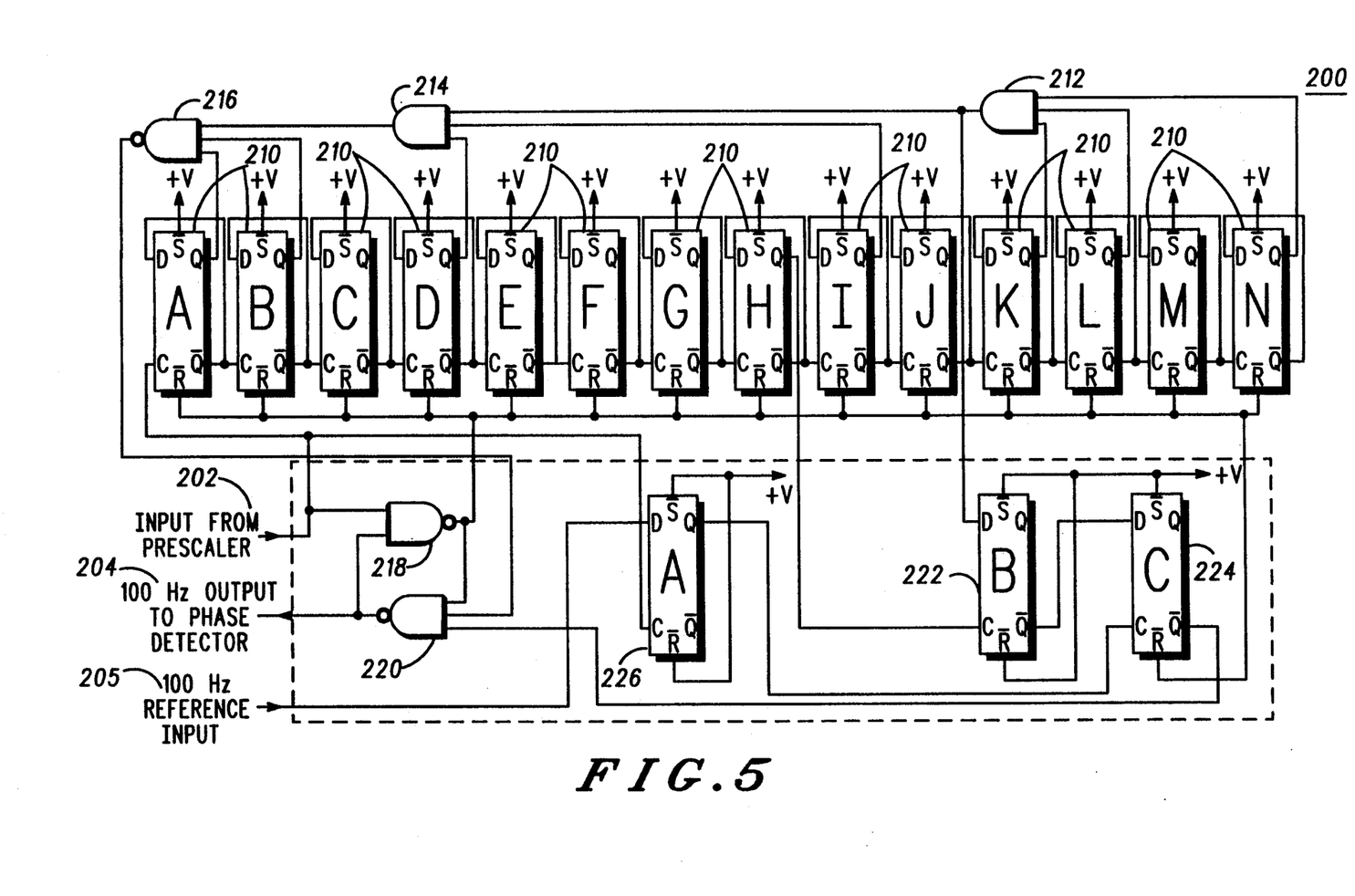
FIG. 5 shows an implemenation used in the preferred embodiment for an asynchronously resettable frequency divider and a frequency divider reset means.

Turning to FIG. 5, there is shown the implementation of the main counter (200) of the programmable divider (25) shown in FIG. 3 but excluding the variable prescaler (100) and the modulus control circuits (300) shown in FIG. 4. FIG. 5 depicts the main counter (200) (ripple counter D flip-flops 210A–210N and gates 212, 214, and 216) and a frequency divider reset means, (NAND gates 218, 220 and flip-flop circuits 226, 222, and 224, which gates and latches are also considered data latch devices in general and which are enclosed in the phantom lines) coupled to the counter (200) for asynchronously resetting the counter when the phase difference between the low frequency reference signal (from the low frequency reference signal source, which is a signal source comprised of the 7.2 MHz. signal from oscillator, 32, divided by circuit 34, which signal is designated by reference numeral A in FIG. 3) and the output frequency of the programmable divider (B shown in FIG. 3) exceeds a predetermined phase angle. This predetermined phase angle difference is determined by the particular taps taken from flip-flops (210K, L, and N) used in the counter and which are described below.

The counter shown in FIG. 5 has a fixed divide ratio of 11,531. The fixed divide ration of 11,531, including the division factor provided by the variable prescaler (100) (i.e., 64 or 65) produces a net division of the 73.8 MHz signal between 738,000 and 738,032. Dividing the output of the VCXO by a number within this range produces a output signal of approximately 100 Hz.

Still referring to FIG. 5, an input signal from the prescaler (202) (which is the 73.8 MHz divided by 64 or 65) is input to a series of 14 D-type flip-flops, connected so that each provides a divide-by-two function. These 14 D-type flip-flops are designated as (210A–210N inclusive). The outputs from D flip-flop cells A, B, D, I, K, L, and N are "ANDed" together through gates 212, 214 and 216, to produce a reset pulse from the R-S latch embodied by NAND gates 218 and 220, for these flip-flops every 11,531 clock cycles. By their configuration, these 14 D flip-flops provide a binary ripple counter, well-known in the art.

The ANDing of the aforementioned outputs produces a reset pulse from the output of NAND gate (216) which is coupled to one input of a NAND gate (220) that together with NAND gate (216) themselves form an RS flip-flop circuit. When the output of NAND gate (216) goes to a logic zero, the output of NAND gate (218) goes to a logic zero on the next rising edge of the input from the prescaler and the output of NAND gate (218) coupled to the reset inputs of these 14 D flip-flops causes all of them to turn to their logical zero output state on the Q outputs.

The invention is embodied in a series of 3 D flip-flops (226, 222 and 224) that together synchronize the reference signal input (205) to the counter to the output pulse from NAND gate 216. D flip-flop (226) synchronizes the edges of the reference signal (which is shown in FIG. 3 as being coupled into the phase detector (40) but in reality is also coupled into the programmable divider (25). A time window in which both the pulse from the reference signal and the 100 Hz output pulse from the counter (25) must occur, is provided by flip-flops (222 and 224) which are driven by the logical AND of counter cells K, L, and N, which cells correspond to counts of 1024, 2048, and 8192 respectively. Flip-flops (222 and 224) are clocked by a pulse provided by the output from the H cell corresponding to the 128 count of the counter stages (210A–N).

Figure 5A:
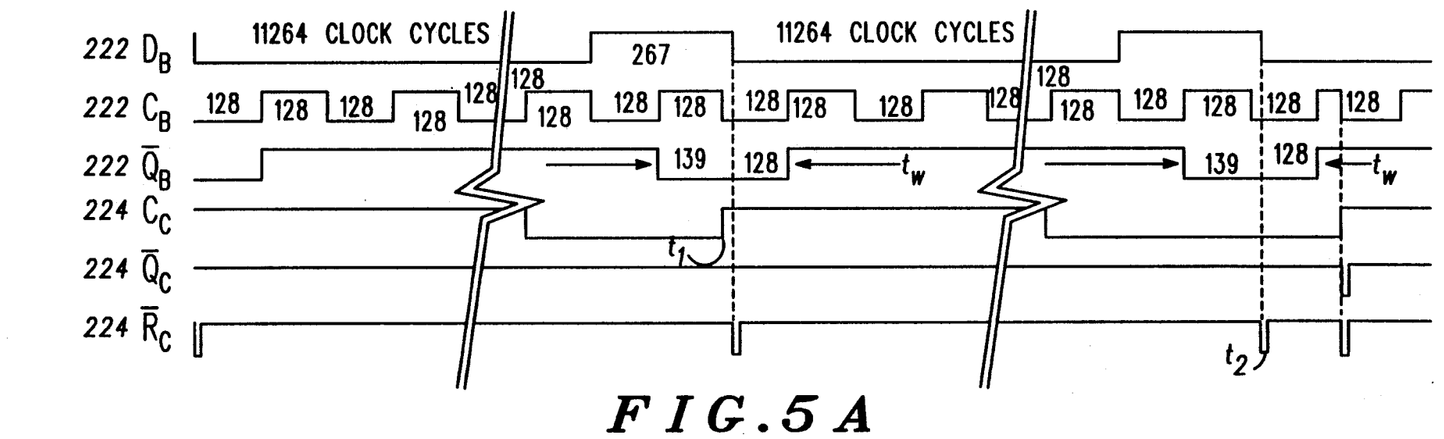
FIG. 5A shows a timing diagram for the frequency divider of FIG. 5.

Referring to the timing diagram shown in FIG. 5A, the output of flip-flop (222) goes low from approximately 139 clock cycles before the reset pulse and stays low until 128 clock cycles after the reset pulse creating a time window approximately centered about this reset pulse. (The reset pulse is the pulse output from NAND gate (218) to reset the counter stages A–N.)

(Referring to FIG. 5A, the rising edge at the C input of flip-flop (222) occurs every 128 clock cycles. The data for flip-flop (222) stays high for 267 clock cycles after 11,264 clock cycles have transpired. This corresponds to the time during which the output from stages K, L, and N, are high where K, L, and N, are the 1024, 2048, and 8192 count outputs. When output stages K, L, and N are all true, the data input to flip-flop (222) is true. Exactly 128 clock pulses after the data to flip-flop (222) goes true, that data is locked in from flip-flop H of the counter (210).)

When the Q output of flip-flop (222) goes high, the complement output of course goes low. From FIG. 5A it can be seen that the Q complement output of flip-flop (222) does in fact go low at the transition of the clock input to flip-flop (222) while the data input is true.

Flip-flop 224 can be clocked from flip-flop (226) at any arbitrary time $T_1$ that is the coincidence of when the 100 Hz reference input signal is high and the rising edge of the input signal (202). If the rising edge of the reference signal on line (205) does not fall within the time window provided by the Q complement output of flip-flop (222) (which is the 139 clock cycles before the reset pulse to 128 clock cycles after the reset pulse), flip-flop 224 generates an extra reset pulse to the counter stages (210A–N).

(This extra reset pulse is provided by the Q complement output of flip-flop (224) causing the NAND gate (220) to change state thereby providing a reset pulse through NAND gate (218) to the counters (210A-210N).))

Flip-flops (226, 222, and 224) provide a so-called frequency divider reset means that resets the counter stages (210A-210N) when the phase difference between the reference signal (on line 205) is not within 139 cycles before or 128 cycles after the occurrence of the rising edge of the reference frequency clock signal. If the reference signal on line 205 does not occur within 139 clock cycles before or 128 clock cycles after the counter is reset, the counter begins counting and, upon the attainment of its final count value, has a higher probability of being coincident with the occurrence of the rising edge of the reference frequency source on line 205.

It is this asynchronous resetting of the frequency divider which reduces the lock-up time of the frequency synthesizer such that the synthesizer is capable of locking up within as little as one time period of the low frequency reference signal.

Figure 5B:
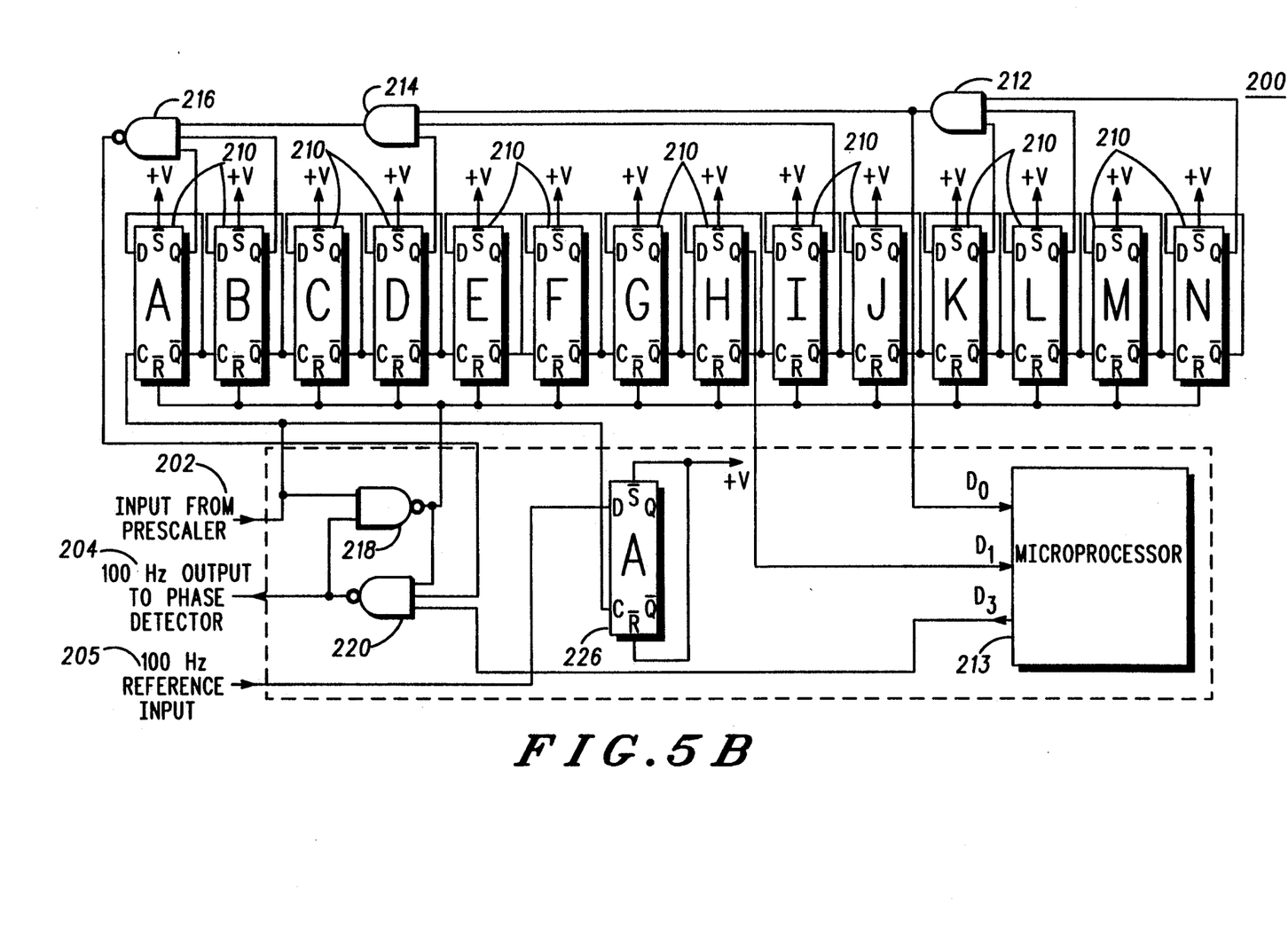
FIG. 5B shows a modification of the frequency divider of FIG. 5.

In the embodiment shown in FIG. 5, the frequency divider reset means was comprised of a plurality of data latches (comprised of flip-flops 226, 222, and 224) coupled to predetermined output bits of the ripple counter comprised of flip-flops (210A-210N). Alternate embodiments of the invention would include increasing or narrowing the window during which the reference pulse must occur thereby increasing or decreasing the maximum, worst-case lock up time for the circuit. Still other alternate embodiments would contemplate using other than D flip-flops for the counter and would include at least using J-K, and T flip flops to embody various types of counters, including possibly both synchronous and asynchronous couters. Those skilled in the art will recognize that the frequency divider reset means comprised of flip-flops (226, 222, and 224) might also be implemented by a suitably capable microprocessor or microcontroller (213) as shown in FIG. 5B. Such an embodiment would be feasible with a suitably capable microprocessor, perhaps an 8051 from Intel or an appropriate Motorola 6800 series microcontroller for example.

Figure 6:
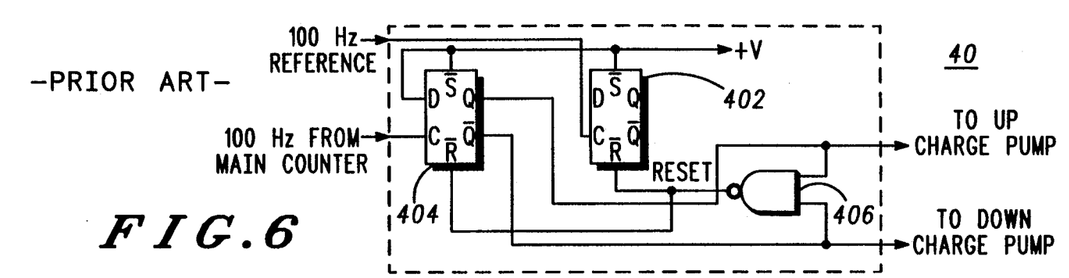
FIG. 6 shows a prior art phase detector used to provide an output signal related to the phase difference between the inputs.
Figure 6A:
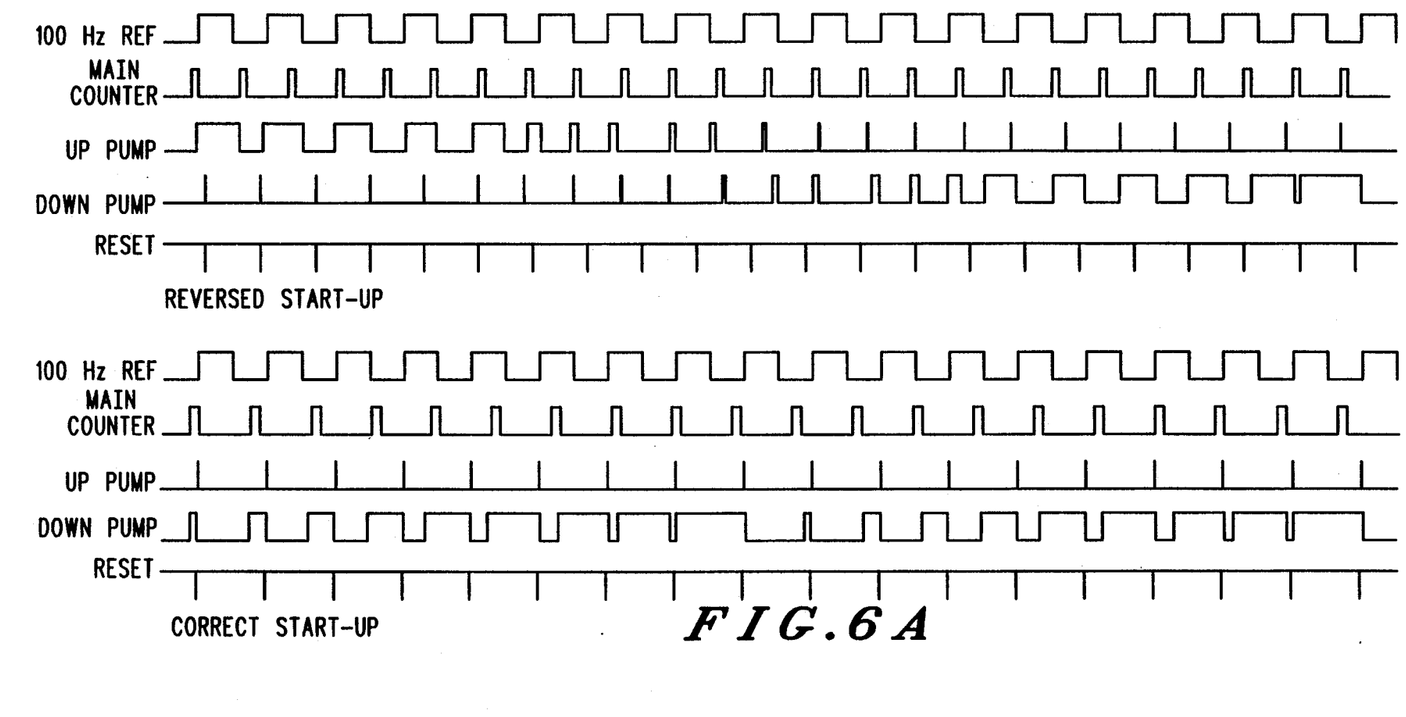
FIG. 6A shows a timing diagram for the phase detector of FIG. 6.

Implementation of the improved frequency divider is augmented by an improved phase detector that is capable of determining which direction the VCXO frequency must be urged towards and provides an output signal proportional, or indicative of, the phase difference between the low frequency reference signal A (shown in FIG. 3), and the low frequency comparison signal B (also shown in FIG. 3). Prior art phase detectors, such as the phase detector shown in FIG. 6 are incapable of knowing whether or not the frequency of the VCXO shown in FIG. 3 should be increased or decreased to bring it into phase synchronization with the reference frequency. In FIG. 6 the 100 Hz reference signal and the 100 Hz output from the main counter depicted in FIG. 5 are used to control two flip-flops the outputs of which control either an up-charge pump or a down-charge pump to respectively increase or decrease the operating frequency of the VCXO.

Figure 7:
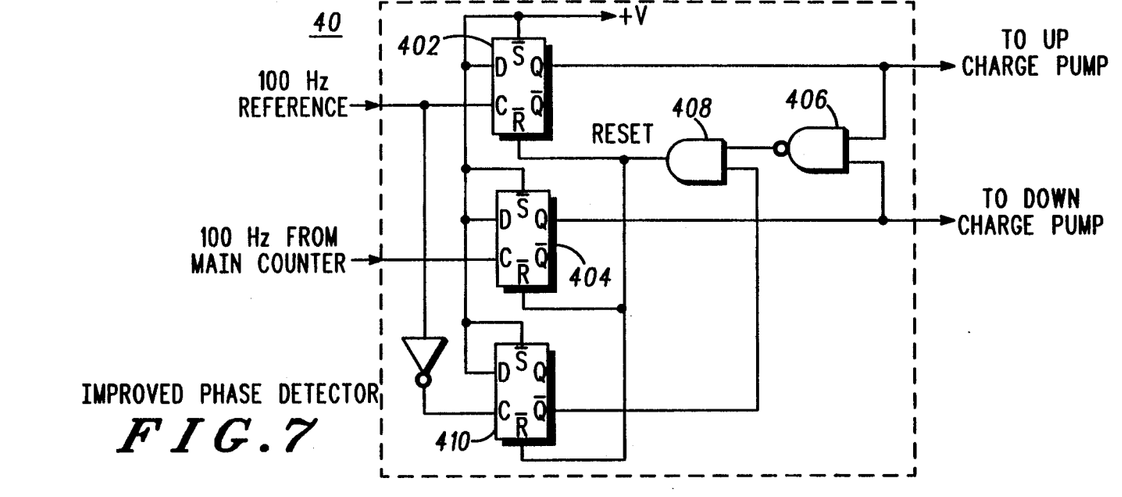
FIG. 7 shows an improved phase detector used in the preferred embodiment of the invention.
Figure 7A:
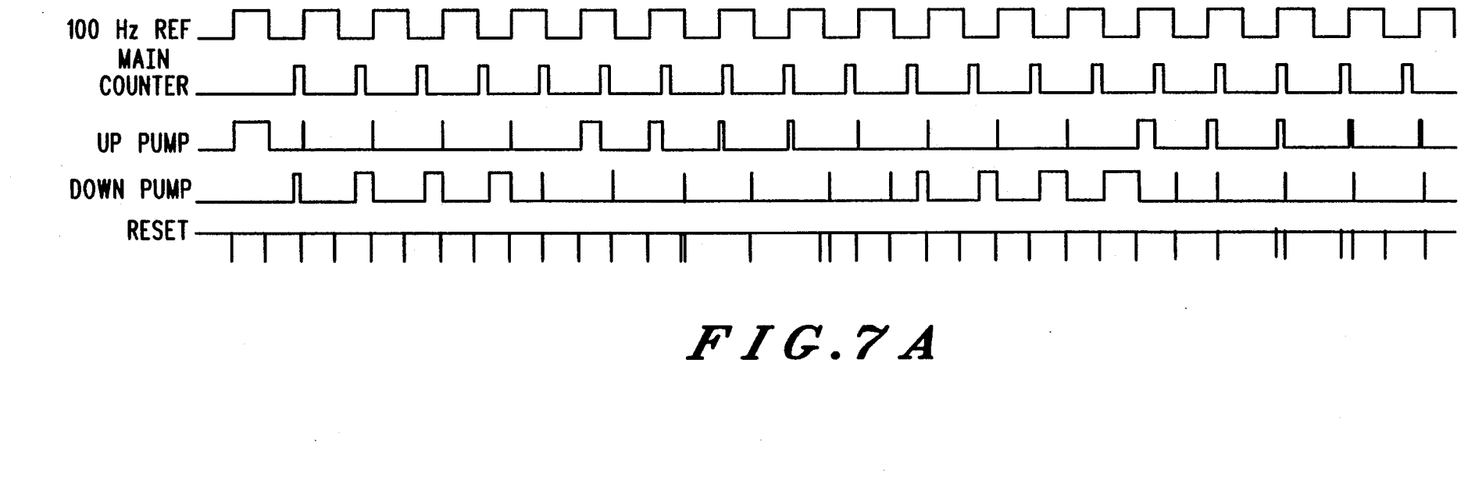
FIG. 7A shows a timing diagram for the phase detector of FIG. 7.

Ambiguity in the direction in which to swing the frequency of the VCXO is solved by using an improved phase detector such as the one shown in FIG. 7. Flip-flops (402, and 404) in combination with the additional flip-flop (410) eliminate any ambiguity in deciding which direction to move the frequency of the VCXO by resetting the phase detector (40) on each negative edge of the reference signal. The reversed operation is limited to the first half cycle of the reference signal as shown in the timing diagram shown as FIG. 7A.

Figure 8:
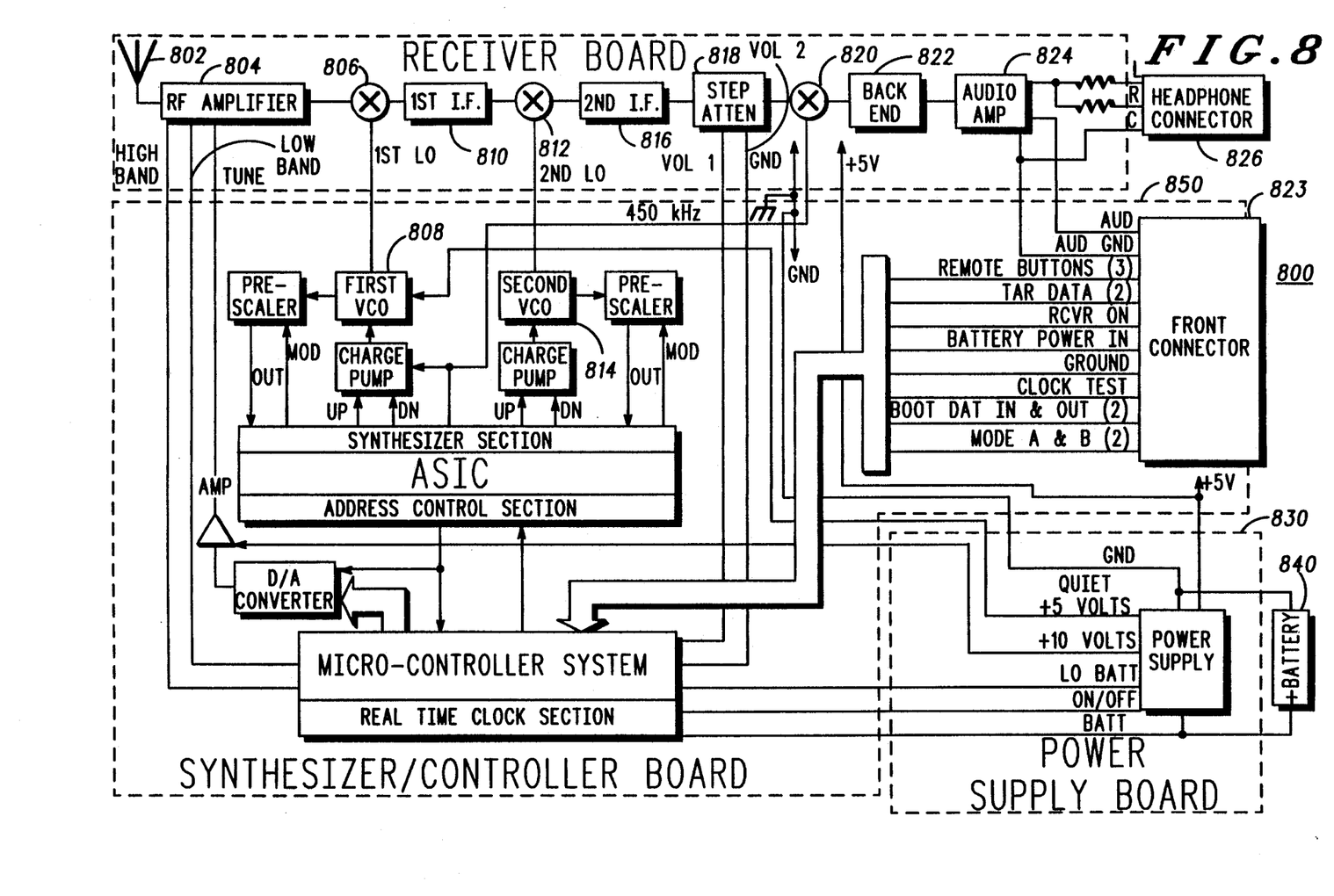
FIG. 8 shows a communications receiver and its implementation with the preferred embodiment of the invention.

Implementation of a communications receiver is depicted in FIG. 8 where the programmable synthesizer as disclosed herein is used for various stages in the receiver.

It can be seen in FIG. 8 that the receiver includes many of the circuits found in a typical radio frequency receiver. An antenna passes signals to an RF amplifier (804) which in turn has its signals down shifted to a first IF frequency by a first mixer (806) and a first IF filter stage (810).

The first intermediate frequency signals are shifted to a lower second intermediate frequency by a second mixer (812) and a second intermediate frequency filter (816). Audio processing is performed largely by a third IF stage (820) and subsequent audio processing circuits (822 and 824) which are well known in the art.

Figure 9:
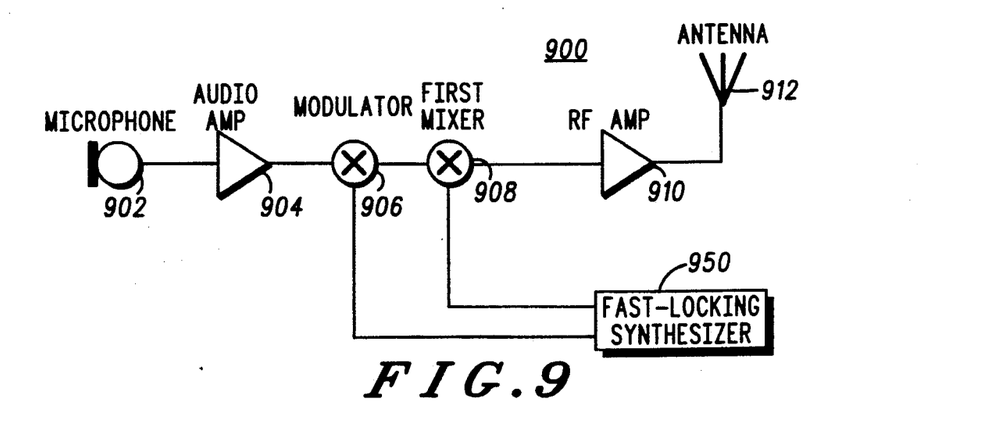
FIG. 9 shows a communications transmitter implemented using a frequency synthesizer disclosed herein.

A radio transmitter device is depicted in FIG. 9 and includes a simplified transmitter circuit. Audio signals from a microphone (902) are amplified (904) and modulated (906). The first mixer stage (908) receiving signals from a synthesizer such as the one depicted herein (950) has its output amplified by an RF amplifier stage (910) to a level suitable for broadcast from the antenna (912).

What is claimed is:

1. A fast-locking frequency synthesizer providing a high frequency output signal in small incremental steps comprised of:

a narrow output frequency range, voltage controlled oscillator (VCO) providing said output signal and having an input for controlling the frequency of its output signal;

an asynchronously resettable frequency divider, coupled to the voltage controlled oscillator output signal providing a low frequency comparison signal;

a low frequency reference signal source having an output;

a phase detector providing an output signal proportional to the phase difference between the reference signal and the comparison signal which controls the frequency of the VCO; and frequency divider reset means, coupled to said resettable frequency divider and said low frequency reference signal, for asynchronously resetting said frequency divider when the phase difference between the low frequency reference signal and the output of the frequency divider exceeds a predetermined phase angle difference;

whereby the output signal of said VCO is capable of being phase locked to said low frequency reference signal substantially within one time period of said low frequency reference signal.

2. The frequency synthesizer of claim 1 where said frequency divider reset means is comprised of a plurality of data latch devices coupled to predetermined output digits of a digital counter within said asynchronously resettable frequency divider and coupled to said low frequency reference signal, which plurality of data latches provide a count-time period of a number of pulses from the VCO during which the asynchronously resettable frequency divider cannot be reset.

3. The frequency synthesizer of claim 1 where said frequency divider reset means is comprised of a microprocessor.

4. The fast-locking frequency synthesizer of claim 1 further comprised of a relative phase detector means for determining a requisite direction of frequency adjustment to the voltage controlled oscillator required to achieve phase synchronization between the reference frequency and the voltage controlled oscillator.

5. The fast-locking frequency synthesizer of claim 4 where said relative phase detector means is comprises of a digital phase detector having a means for resetting said digital phase detector on each negative-going edge of said low frequency reference signal.

6. The fast-locking frequency synthetizer of claim 4 where said relative phase detector means is comprised of a microprocessor.

7. In a communications receiver comprised of an antenna, an RF amplifier receiving signals from said antenna, a first mixer receiving signals from said RF amplifier and an output signal from an oscillator, a first intermediate frequency filter receiving signals from said first mixer and an audio amplifier stage coupled to said first mixer for recovering audible information from the output signals of said first mixer, an improvement comprised of:
a fast-locking frequency synthesizer coupled to at least said first mixer, said fast-locking frequency synthesizer comprised of:
a narrow output frequency range, voltage controlled oscillator (VCO) providing said output signal and having an input for controlling the frequency of its output signal;
an asynchronously resettable frequency divider, coupled to the voltage controlled oscillator output signal providing a low frequency comparison signal;
a low frequency reference signal source having an output;
a phase detector providing an output signal proportional to the phase difference between the reference signal and the comparison signal which controls the frequency of the VCO; and frequency divider reset means, coupled to said resettable frequency divider and said low frequency reference signal, for asynchronously resetting said frequency divider when the phase difference between the low frequency reference signal and the output of the frequency divider exceeds a predetermined phase angle difference.

8. In a communications transmitter comprised of: a first mixer, receiving information-bearing modulated signals from a modulator and receiving high frequency oscillating signals from an oscillator and producing modulated radio frequency signals, an antenna, and an RF amplifier receiving signals from said first mixer and coupling signals to said antenna, an improvement comprised of:
a fast-locking frequency synthesizer coupled to at least said first mixer providing said high frequency oscillating signals, said fast-locking frequency synthesizer comprised of:
a narrow output frequency range, voltage controlled oscillator (VCO) providing said high frequency oscillating signals and having an input for controlling the frequency of its output signal;
an asynchronously resettable frequency divider, coupled to the voltage controlled oscillator output signal providing a low frequency comparison signal;
a low frequency reference signal source having an output;
a phase detector providing an output signal proportional to the phase difference between the reference signal and the comparison signal which controls the frequency of the VCO; and frequency divider reset means, coupled to said resettable frequency divider and said low frequency reference signal, for asynchronously resetting said frequency divider when the phase difference between the low frequency reference signal and the output of the frequency divider exceeds a predetermined phase angle difference.

* * * * *